United States Patent
Fauty et al.

[11] Patent Number: 6,164,523
[45] Date of Patent: Dec. 26, 2000

[54] ELECTRONIC COMPONENT AND METHOD OF MANUFACTURE

[75] Inventors: Joseph K. Fauty; James P. Letterman, Jr., both of Mesa; Michael J. Seddon, Gilbert, all of Ariz.

[73] Assignee: Semiconductor Components Industries, LLC, Phoenix, Ariz.

[21] Appl. No.: 09/108,448

[22] Filed: Jul. 1, 1998

[51] Int. Cl.$^7$ .......................... B23K 31/00; B23K 31/02; H05K 3/00
[52] U.S. Cl. .......................... 228/180.5; 29/843
[58] Field of Search .................. 228/904, 180.5, 228/246; 29/893

[56] References Cited

U.S. PATENT DOCUMENTS

| | | | |
|---|---|---|---|
| 3,413,711 | 12/1968 | Brewer et al. | 29/473.1 |
| 3,672,047 | 6/1972 | Sakamoto et al. | 29/628 |
| 4,014,660 | 3/1977 | Schreiner et al. | 29/183.5 |
| 4,463,059 | 7/1984 | Bhattacharya et al. | 428/620 |
| 5,047,833 | 9/1991 | Gould | 357/71 |
| 5,288,007 | 2/1994 | Interrante et al. | 228/119 |
| 5,445,311 | 8/1995 | Trask et al. | 228/175 |
| 5,483,741 | 1/1996 | Akram et al. | 29/846 |
| 5,612,256 | 3/1997 | Stansbury | 437/209 |
| 5,841,183 | 11/1998 | Ariyoshi | 257/536 |
| 5,852,871 | 12/1998 | Khandros | 29/843 |
| 5,900,738 | 5/1999 | Khandros et al. | 324/761 |
| 5,904,496 | 5/1999 | Richards et al. | 438/106 |
| 5,906,312 | 5/1999 | Zakel et al. | 228/846 |

*Primary Examiner*—Patrick Ryan
*Assistant Examiner*—L. Edmondson
*Attorney, Agent, or Firm*—Robert D. Atkins; Michael T. Wallace

[57] ABSTRACT

A method of manufacturing an electronic component includes providing a substrate (101), forming a semiconductor device in the substrate (101), depositing a metal layer (107) over the substrate (101) and electrically coupled to the semiconductor device, depositing a layer (108) of solder over the metal layer, and wire bonding a wire (109) to the metal layer (107).

9 Claims, 3 Drawing Sheets

ELECTRONIC COMPONENT AND METHOD OF MANUFACTURE

BACKGROUND OF THE INVENTION

This invention relates, in general, to electronics, and more particularly, to electronic components and methods of manufacture.

Wedge bonded aluminum wire bonds are used to electrically connect a semiconductor device to a leadframe. For high power devices, the aluminum wire bonds are typically 0.1 to 0.7 millimeter in diameter to provide high current carrying capacity. However, devices using aluminum wires have a higher on resistance compared to copper wires, and the higher on resistance degrades the electrical performance of the devices. Furthermore, in order to increase conductivity, either more than one aluminum wire must be bonded to the bonding pad or multiple bonds must be made with the same wire. However, these extra manufacturing steps reduce productivity.

The use of copper wires reduces the on resistance and improves the electrical performance of the devices over that of aluminum wires, but the use of copper wires reduces the manufacturability of the devices. In particular, large diameter copper wires cannot be bonded to bonding pads without damaging the device by cracking or forming craters in the semiconductor substrate or overlying dielectric layers.

Accordingly, a need exists for an improved method of manufacture that produces an electronic component that is suitable for use in high power applications, that has low on resistance, and that will improve productivity.

BRIEF DESCRIPTION OF THE DRAWINGS

For simplicity and clarity of illustration, elements in the drawings are not necessarily drawn to scale, and the same reference numerals in different figures denote the same elements.

DETAILED DESCRIPTION OF THE DRAWINGS

Figure 1:
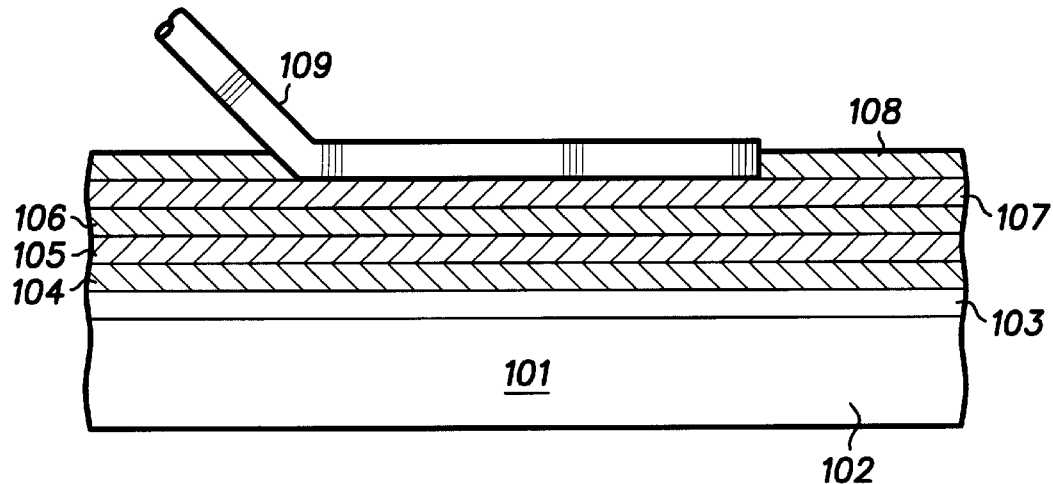
FIG. 1 illustrates a partial schematic view of an embodiment of an electronic component in accordance with the present invention.

FIG. 1 illustrates a partial schematic view of an electronic component 100. Component 100 includes a substrate 101, an electrically insulative layer 103 over substrate 101, electrically conductive layers 104, 105, 106, 107, and 108 over layer 103, and a wire 109 bonded to layers 107 and 108. Substrate 101 supports a semiconductor device, which is indicated generally by element 102 in FIG. 1 and which can be a diode, transistor, integrated circuit, or the like. Accordingly, substrate 101 can be comprised of a semiconductor material and can also include additional electrically insulative layers and electrically conductive layers for proper electrical wiring and isolation of different portions of the semiconductor device.

Layer 103 can be a single layer or a plurality of layers comprised of, for example, silicon dioxide and silicon nitride. Layer 103 electrically isolates portions of substrate 101 from the overlying electrically conductive layers 104, 105, 106, 107, and 108. Layer 103 has vias (not illustrated in FIG. 1) through which the overlying layers 104, 105, 106, 107, and 108 are electrically coupled to other portions of substrate 101 and the semiconductor device.

Layers 104, 105, 106, 107, and 108 form a bonding pad for component 100. Layers 104, 105, 106, 107, and 108 are sequentially disposed or deposited over layer 103 and can be located over the semiconductor device. Layers 104 and 106 are optional adhesive or barrier layers; layer 105 is an interconnect layer; layer 107 is a solderable metallization layer; and layer 108 is a solder layer. As an example, layers 104 and 106 can be made of titanium tungsten, titanium nitride, titanium tungsten nitride, chromium, or the like. As an additional example, layer 105 can be made of copper, aluminum, aluminum silicon, aluminum copper, aluminum silicon copper, or the like. Furthermore, layer 107 can be made of a plurality of layers such as, for example, (1) titanium, nickel, and silver, (2) electroless nickel and immersion gold, (3) chromium, nickel, and silver, (4) sputtered copper and plated copper, (5) sputtered copper, electroless nickel, and immersion gold, or the like. Layer 108 can be comprised of an appropriate solder including, but not limited to, any lead-based, tin-based, or gold-based solder such as, for example, 95% lead and 5% tin or 40% lead and 60% tin. To maintain the integrity and reliability of component 100, layer 108 should have a deformation or melting temperature that is at least approximately ten degrees Celsius higher than the highest operating temperature of component 100.

An end of wire 109 is wire bonded to contact layer 108. Wire 109 is preferably suitable for use in high power applications. Accordingly, wire 109 preferably has a large diameter greater than or equal to approximately 0.1 millimeter. Furthermore, to reduce the on resistance of component 100, wire 109 can be comprised of copper instead of aluminum because copper has approximately thirty-three percent lower resistivity compared to aluminum. Preferably, wire 109 consists essentially of copper. Also, the copper of wire 109 is preferably fully annealed or over annealed in order to prevent wire 109 from being too stiff or too hard for reasons explained hereinafter. Wire 109 can be comprised of copper alloys, but the alloys are preferably not stiffer than pure copper for the same reasons.

Figure 2:
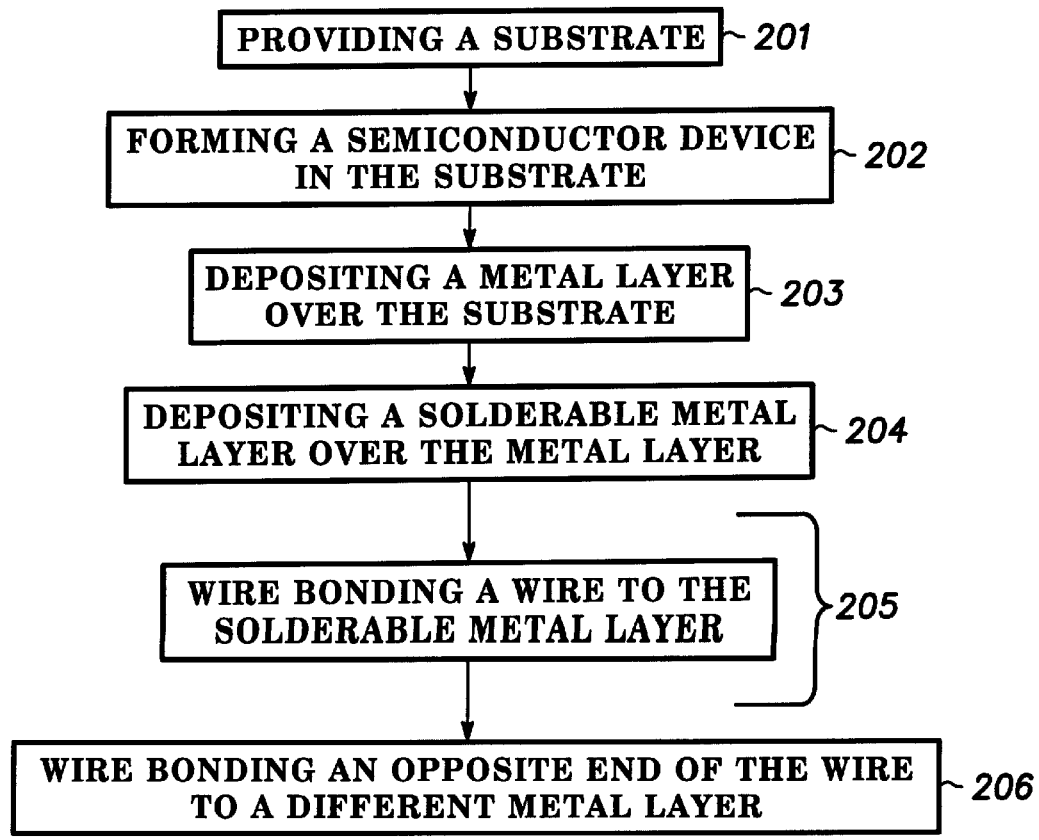
FIG. 2 outlines a method of manufacturing the electronic component of FIG. 1 in accordance with the present invention.

FIG. 2 outlines a method 200 for manufacturing component 100 of FIG. 1. In general, method 200 uses solder in an automated wire bonding process. Method 200 includes a step 201 for providing a substrate, such as substrate 101 of FIG. 1. Method 200 continues with a step 202 for forming a semiconductor device, such as element 102 of FIG. 1, in the substrate. Then, a step 203 deposits at least one metal layer, such as layers 104, 105, and 106 of FIG. 1, over the substrate and the semiconductor device. Next, a step 204 deposits a solderable metal layer, such as layer 107 of FIG. 1, over the non-solderable metal layer.

Method 200 subsequently continues with a step 205 for wire bonding a wire, such as wire 109 of FIG. 1, to the solderable metal layer underneath the solder layer. Step 205 is explained in more detailed hereinafter in FIG. 3. Then, a step 206 wire bonds an opposite end of the wire to a different metal layer. In the preferred embodiment, the substrate of step 201 is mounted onto a flag of a leadframe before performing step 205, and the different metal layer of step 206 is a lead of the leadframe.

Figure 3:
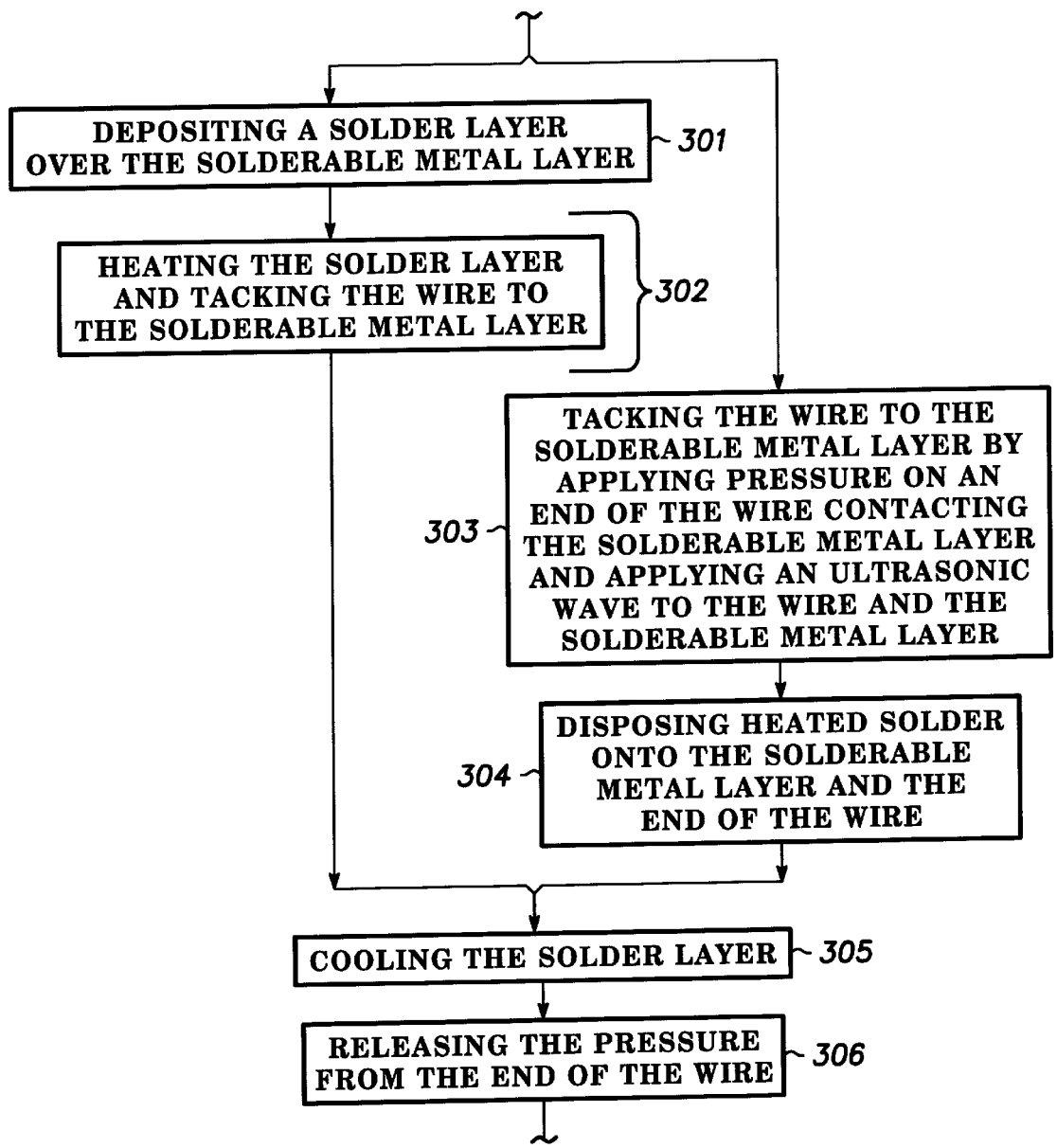
FIG. 3 provides a more detailed outline of a step in the method of FIG. 2 in accordance with the present invention.

FIG. 3 provides a more detailed outline of step 205 in method 200 of FIG. 2. As illustrated in FIG. 3, step 205 branches off into two possible paths for wire bonding a wire to a solderable metal layer. Each of the two branches deposits a solder layer over the solderable metal layer and tacks the wire to the solderable metal layer in a different sequence. As explained in more detail hereinafter, the solder layer improves the electrical performance of the electronic component and also improves the mechanical strength of the bond between the wire and the solderable metal layer.

The left branch of step 205 in FIG. 3 includes a step 301. Step 301 deposits a solder layer, such as layer 108 of FIG. 1, over the solderable metal layer. As an example, the solder layer can have a thickness of approximately twenty-five micrometers. The left branch of step 205 in FIG. 3 then continues with a step 302 for heating the solder layer and tacking the wire to the solderable metal layer. Step 302 is explained in more detail hereinafter in FIG. 4.

The right branch of step 205 in FIG. 3 includes a step 303 for tacking the wire to the solderable metal by applying pressure on an end of the wire contacting the solderable metal layer and by applying an ultrasonic wave to the wire and the solderable metal layer. The ultrasonic power forms a weak mechanical bond between the wire and the solderable metal layer. Step 303 is performed before any solder is disposed over the solderable metal layer. Then, the right branch of step 205 in FIG. 3 continues with a step 304 for disposing heated solder onto the solderable metal layer and the end of the wire to more securely bond the end of the wire to the solderable metal layer. Although step 303 begins before step 304, step 303 preferably continues during the performance of step 304, in which case step 304 is a thermosonic process.

After completing either the right or left branch, step 205 in FIG. 3 continues with a step 305 for cooling or otherwise solidifying or hardening the solder layer. The ultrasonic wave of step 303 is preferably not continued into step 305 so that the solder can properly solidify and reinforce the bond between the wire and the solderable metal layer. However, the applied pressure on the end of the wire in step 303 is maintained on the end of the wire during step 305 to ensure that the tack bond of steps 302 and 303 is not broken before the solder solidifies. A step 306 subsequently releases the applied pressure to complete the wire bonding process of step 205.

Figure 4:
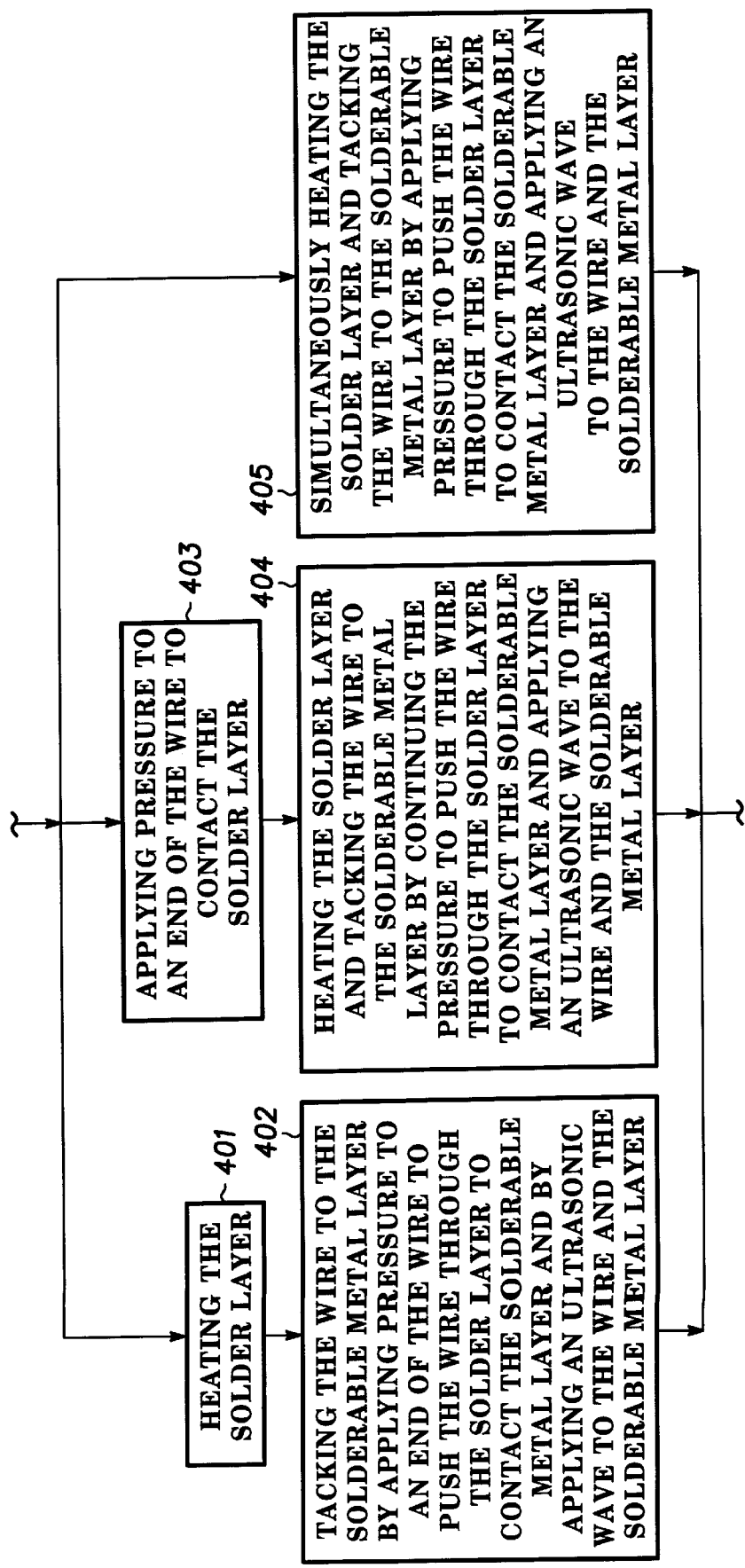
FIG. 4 provides a more detailed outline of a portion of the step in FIG. 3 in accordance with the present invention.

FIG. 4 provides a more detailed outline of step 302 of FIG. 3. As illustrated in FIG. 4, step 302 branches off into three possible paths for wire bonding a wire to a solderable metal layer. Each of the three branches heats the solder layer and tacks the wire to the solderable metal layer in a different sequence.

The left branch of step 302 in FIG. 4 performs the solder heating step before the wire tacking step. In particular, the left branch includes a step 401 for first heating the solder layer in order to soften or reflow the solder layer. The solder layer can be heated by directly heating the solder layer or by indirectly heating the solder layer through the underlying substrate. As an example, the heat can be applied by a pulse heating method similar to that used in tape automated bonding techniques.

Then, the left branch of step 302 in FIG. 4 continues with a step 402 for tacking the wire to the solderable metal layer by applying pressure to an end of the wire to push the wire through the softened solder layer to contact the solderable metal layer. However, the applied pressure should be high enough to break through the surface tension of the molten or softened solder layer. Step 402 also includes applying an ultrasonic wave to the wire and the solderable metal layer. The ultrasonic power forms a weak mechanical bond between the wire and the solderable metal layer. Although step 401 begins before step 402, step 401 can continue during the performance of step 402, which makes step 402 a thermosonic step.

The center option of step 302 in FIG. 4 includes a step 403 for applying pressure to an end of the wire to contact the solder layer. The applied pressure should be similar to that previously described in step 402. Then the center option continues with a step 404 for heating the solder layer and tacking the wire to the solderable metal layer located underneath the solder layer. Step 404 continues the pressure of step 403 to push the end of the wire through the softened solder layer to contact the underlying solderable metal layer. Step 404 also includes an ultrasonic process similar to the one described earlier in step 402. Thus, step 404 is a thermosonic step. In step 404, the solder layer can be heated as previously described in step 401, or the solder layer can be heated indirectly through the wire.

The right branch of step 302 in FIG. 4 includes a step 405 for simultaneously heating the solder layer and tacking the wire to the solderable metal layer. The tacking technique of step 405 can include pressure and ultrasonic processes similar to those previously described in steps 402 and 404. Accordingly, step 405 can be a thermosonic step. As an example, the simultaneous heating and tacking can be accomplished by heating an end of the wire with a high temperature hydrogen flame and then contacting the heated wire to the solder layer.

When copper wires are used in automated wire bonding processes of the prior art, the amount of pressure or force required is at least two times greater than for the same sized aluminum wire. This increase in pressure is needed because copper is harder and less malleable than aluminum. However, the increase in pressure produces many problems including, but not limited to, die cracking and crater formation.

The use of solder in the method and component described herein enables the use of lower pressure in wire bonding processes compared to the prior art. In fact, with the use of solder, the pressures used for large diameter aluminum wires can also be used for the same sized copper wires. The pressures used for large diameter aluminum wires do not produce the problems associated with the previously required higher pressures for copper wires. As an example, for a 0.1 millimeter diameter copper wire, the method described herein can use approximately one hundred fifty grams of force compared to the three hundred fifty grams of forced required when solder is not used.

Prior art automated wire bonding techniques have been in common use since the early 1960's, but have never used solder. The prior art automated wire bonding techniques replaced the manual wire soldering techniques. The manual wire soldering techniques did not wire bond or tack the wire to the bonding pad. Instead, the wire soldering techniques only used solder to hold the wire in place to contact the bonding pad.

The tacking techniques of the wire bonding processes described herein are automated processes that preferably use a wedge bonding technique and preferably do not use a ball bonding technique. A wedge bonding technique does not deform the end or tip of the wire into a ball having a diameter three times or larger than the diameter of the wire, as in a ball bonding technique. Therefore, the wedge bonding technique can be used with smaller bonding pads, which produce smaller and less expensive semiconductor components.

The tacking processes of steps 303, 402, 404, and 405 form a weak bond between the wire and the solderable metal layer. The solidified solder improves or strengthens the mechanical bond between the wire and the solderable metal layer. Furthermore, the solder also increases the electrical contact area between the wire and the solderable metal layer, and the increase in contact area reduces the on resistance to improve the electrical performance of the component. To reduce the cost of manufacturing the semiconductor component, solder is preferably not used in the wire bonding process of step 206 in FIG. 2.

Therefore, an improved electronic component and method of making is provided to overcome the disadvantages of the prior art. The electronic component is suitable for high power applications, has low on resistance, and can be manufactured in a shorter cycle time, as stated herein. The thermosonic wedge bonding process described herein uses solder at the bond pads of the electronic component to form a highly conductive structure that reduces the on resistance of the electronic component to improve the electrical performance of the semiconductor component. The use of solder at the bond pads enables the use of larger diameter copper wires to further reduce the on resistance and to also eliminate the need for multiple wires and stitch bonding. The elimination of multiple wires and stitch bonding reduces the cycle time needed to manufacture the semiconductor component. The wedge bonding process also consumes less space across the substrate compared to a conventional ball bonding process.

While the invention has been particularly shown and described mainly with reference to preferred embodiments, it will be understood by those skilled in the art that changes in form and detail may be made without departing from the spirit and scope of the invention. For instance, the numerous details set forth herein such as, for example, the specific dimensions and the specific material compositions are provided to facilitate the understanding of the present invention and are not provided to limit the scope of the invention. As an example, although layer 108 in FIG. 1 is described to be comprised of solder, it is understood that other electrically conductive or adhesive layers can be substituted for, or used in addition to, the solder.

Additionally, wire 109 of FIG. 1 can have a core comprised of aluminum and an outer coating consisting essentially of copper or vice versa. Furthermore, wire 109 of FIG. 1 can be coated with solder to eliminate the solder deposition in steps 301 and 304 of FIG. 3. Moreover, the applied pressure of steps 402, 404, and 405 in FIG. 4 can be reduced and the ultrasonic wave of those same steps can be eliminated so as not to tack the wire to the solderable metal layer. In this embodiment, the cooled solder would be keep the wire attached to the solderable metal layer.

As another example, step 205 in FIG. 2 can be modified to eliminate the solder and to wedge bond or tack the wire to the solderable metal layer with enough strength to permit step 206 to be performed without detaching the wedge bond. After step 206, solder can be dispensed and/or reflowed around the wedge bond, and then the solder layer can be cooled. As an additional example, in step 301 of FIG. 3, the solder layer can be disposed or provided with a hole exposing a portion of the underlying solderable metal layer. Then, steps 403 and 405 can be modified to insert the wire into the hole to directly contact the exposed solderable metal layer without contacting the solder layer. During steps 404 and 405, the solder layer is reflowed to wick around a contact portion of the wire.

As another example, step 205 in FIG. 2 can be modified to heat the solder layer to a temperature less than its melting point and then to wedge bond or tack the wire to the underlying solderable metal layer with enough strength to permit step 206 to be performed without detaching the wedge bond. After step 206 in FIG. 2, the solder can be reflowed around the wedge bond, and then the solder layer can be cooled. As an additional example, after step 206 of FIG. 2 an additional solder layer can be disposed over the wire and the solderable metal layer. This additional solder layer further increases the contact area between the wire and the solder layer and further decreases the on resistance of the electronic component.

Accordingly, the disclosure of the present invention is not intended to be limiting. Instead, the disclosure of the present invention is intended to be illustrative of the scope of the invention, which is set forth in the following claims.

What is claimed is:

1. A method of manufacturing an electronic component comprising:

providing a silicon substrate having a metal layer over the substrate;

depositing a solderable metal layer over the metal layer; and bonding initially only a first end of a wire to the solderable metal layer.

2. The method of claim 1 wherein the bonding step further comprises:

providing a wire comprised of copper and having a diameter of greater than or equal to approximately 0.1 millimeter;

providing a solder layer; and wedge bonding the wire to the solder layer while heating the solder and while applying an ultrasonic wave to the wire.

3. The method of claim 2 wherein the bonding step further comprises:

softening the solder layer;

applying pressure to a wire to push the wire into the solder layer; and hardening the solder layer.

4. The method of claim 3 wherein the applying step occurs before the softening step.

5. The method of claim 3 wherein the applying step occurs simultaneously with the softening step.

6. The method of claim 2 wherein the depositing step further comprises providing the solder layer with a hole exposing a portion of the solderable metal layer, and wherein the bonding step further comprises:

contacting the wire to the portion of the solderable metal layer; and reflowing the solder to wick the solder around a contact portion of the wire.

7. The method of claim 6 wherein the contacting step includes preventing the wire from contacting the solder layer.

8. The method of claim 1 wherein the bonding step further comprises:
contacting the wire to the solderable metal layer; and
applying solder to the wire and the solderable metal layer after the contacting step.

9. The method of claim 1 wherein the bonding step further comprises contacting a wire coated with solder to the solderable metal layer.

* * * * *

UNITED STATES PATENT AND TRADEMARK OFFICE
CERTIFICATE OF CORRECTION

PATENT NO.         : 6,164,523
APPLICATION NO.    : 09/108448
DATED              : December 26, 2000
INVENTOR(S)        : Joseph K. Fauty et al.

Page 1 of 1

It is certified that error appears in the above-identified patent and that said Letters Patent is hereby corrected as shown below:

Col. 6, Claims 1, 2, and 3 are deleted and replaced with the following claims 1, 2, and 3:

1. A method of manufacturing an electronic component comprising:
   providing a silicon substrate having a metal layer over the substrate;
   depositing a solderable metal layer over the metal layer;
   wire bonding a first end of a wire to the solderable metal layer; and
   depositing solder over the solderable metal layer and the first end of the wire to bond the first end of the wire to the solderable metal layer while allowing the rest of the wire to remain flexible.

2. A method of manufacturing an electronic component comprising:
   providing a silicon substrate having a metal layer over the substrate;
   depositing a solderable metal layer over the metal layer;
   providing a solder layer; and
   wire bonding a first end of a wire to the solderable metal layer through the solder layer while heating the wire and while applying an ultrasonic wave to the wire.

3. The method of Claim 2 wherein the bonding step further comprises:
   softening the solder layer;
   applying pressure to a wire to push the wire into the solderable metal layer; and
   hardening the solder layer.

Signed and Sealed this

Twenty-fourth Day of November, 2009

David J. Kappos
*Director of the United States Patent and Trademark Office*

UNITED STATES PATENT AND TRADEMARK OFFICE
CERTIFICATE OF CORRECTION

PATENT NO. : 6,164,523
APPLICATION NO. : 09/108448
DATED : December 26, 2000
INVENTOR(S) : Joseph K. Fauty et al.

It is certified that error appears in the above-identified patent and that said Letters Patent is hereby corrected as shown below:

Col. 6, lines 18-41, Claims 1, 2, and 3 are deleted and replaced with the following claims 1, 2, and 3:

1. A method of manufacturing an electronic component comprising:
   providing a silicon substrate having a metal layer over the substrate;
   depositing a solderable metal layer over the metal layer;
   wire bonding a first end of a wire to the solderable metal layer; and
   depositing solder over the solderable metal layer and the first end of the wire to bond the first end of the wire to the solderable metal layer while allowing the rest of the wire to remain flexible.

2. A method of manufacturing an electronic component comprising:
   providing a silicon substrate having a metal layer over the substrate;
   depositing a solderable metal layer over the metal layer;
   providing a solder layer; and
   wire bonding a first end of a wire to the solderable metal layer through the solder layer while heating the wire and while applying an ultrasonic wave to the wire.

3. The method of Claim 2 wherein the bonding step further comprises:
   softening the solder layer;
   applying pressure to a wire to push the wire into the solderable metal layer; and
   hardening the solder layer.

This certificate supersedes the Certificate of Correction issued November 24, 2009.

Signed and Sealed this

Twenty-ninth Day of December, 2009

David J. Kappos
*Director of the United States Patent and Trademark Office*